(12) United States Patent
Lee

(10) Patent No.: US 11,503,707 B2
(45) Date of Patent: Nov. 15, 2022

(54) MANUFACTURING METHOD OF MULTILAYERED BOARD

(71) Applicant: UNIJET CO., LTD., Seongnam-si (KR)

(72) Inventor: Sung-jin Lee, Seoul (KR)

(73) Assignee: UNIJET CO., LTD., Seongnam-si (KR)

( * ) Notice: Subject to any disclaimer, the term of this patent is extended or adjusted under 35 U.S.C. 154(b) by 744 days.

(21) Appl. No.: 16/411,153

(22) Filed: May 14, 2019

(65) Prior Publication Data

US 2019/0357353 A1 Nov. 21, 2019

(30) Foreign Application Priority Data

May 21, 2018 (KR) ........................ 10-2018-0057789

(51) Int. Cl.
| | |
|---|---|
| H05K 1/02 | (2006.01) |
| H05K 3/40 | (2006.01) |
| H05K 3/46 | (2006.01) |
| H01L 21/02 | (2006.01) |
| H01L 21/768 | (2006.01) |

(52) U.S. Cl.
CPC ..... *H05K 1/0298* (2013.01); *H01L 21/02288* (2013.01); *H01L 21/76892* (2013.01); *H05K 1/0274* (2013.01); *H05K 3/4069* (2013.01); *H05K 3/4685* (2013.01); *H05K 3/4664* (2013.01); *H05K 2201/10121* (2013.01); *H05K 2203/013* (2013.01); *H05K 2203/1173* (2013.01)

(58) Field of Classification Search
CPC .. H05K 3/4069; H05K 3/4664; H05K 3/4647; H05K 3/125; H05K 2201/10121; H05K 1/0298; H05K 1/0274; G02B 6/13
See application file for complete search history.

(56) References Cited

U.S. PATENT DOCUMENTS

| | | | | |
|---|---|---|---|---|
| 2004/0106223 | A1* | 6/2004 | Kaneko ................. | G02B 7/025 427/162 |
| 2006/0292769 | A1* | 12/2006 | Wada ................... | H05K 3/4647 438/179 |
| 2013/0235451 | A1* | 9/2013 | Kubota ................ | G02B 3/0075 359/355 |

FOREIGN PATENT DOCUMENTS

KR  10-0836654 B1  6/2008

* cited by examiner

*Primary Examiner* — Livius R. Cazan
(74) *Attorney, Agent, or Firm* — Revolution IP, PLLC

(57) ABSTRACT

A manufacturing method of a multilayered board, includes: a dot pattern forming process that forms a dot pattern comprising at least one hemispherical micro-lens shape by repeating a process of forming one hemispherical micro-lens shape by jetting one droplet for forming the dot pattern in an inkjet manner; and a stack pattern forming process that forms a stack pattern having a thickness less than that of the micro-lens by jetting a droplet for forming the stack pattern on a predetermined area around the dot pattern in the inkjet manner.

4 Claims, 4 Drawing Sheets

MANUFACTURING METHOD OF MULTILAYERED BOARD

TECHNICAL FIELD

The present invention relates to a manufacturing method of a multilayered board, and more particularly, to a manufacturing method of a multilayered board, which is capable of realizing a shape of a connection portion, which connects each of layers of a multilayered board, with high precision by adopting a method of jetting one droplet in an inkjet manner to form one hemispherical micro-lens.

BACKGROUND ART

A printed circuit board (PCB) represents a board in which a circuit pattern is printed so that electronic elements are electrically connected.

In general, a high density interconnection PCB is manufactured by a lithography method using etching or laser method instead of the conventional screen printing method.

That is, the lithography method is a method for forming a conductive line such that a conductive layer is provided on a base board, an unnecessary portion of the conductive layer is removed by a photolithography and etching method, and the conductive layer except for a circuit is melt-removed by an etching solution, thereby remaining only a necessary conductive line.

This method is the oldest method of general methods for manufacturing PCB. Also, this method requires facilities for treating waste water or the like generated during processes and extremely high process costs due to complex processes such as developing, etching, striping and plating.

However, as electronic devices are miniaturized, a circuit requires integration and multi-functionality.

In recent years, an embedded printed circuit board, in which electronic elements are mounted inside the board, has been actively researched. Under this circumstance, miniaturization and simplicity of printing processes are extremely required.

To this end, although a technology for forming a circuit pattern by using a printing technology is suggested, the typical printing technology hardly realizes a precise shape because a printed area has a non-uniform outer portion and shape.

That is, as illustrated in FIG. 1, although a micro-size pattern may be realized by being reduced in size, as the size gradually decreases, the outer portion and shape of the pattern exhibit poor quality, and reproducibility is remarkably degraded.

Thus, a technology capable of realizing a pattern or a via-hole having a micro-size of about 20 μm is required for integration of the circuit.

PRIOR ART DOCUMENT

Korean Registered Patent No. 10-0836654 (Registration date: Jun. 3, 2008)

DISCLOSURE OF THE INVENTION

Technical Problem

The present invention provides a manufacturing method of a multilayered board, which is capable of realizing a shape of a connection portion, which connects each of layers of a multilayered board, with high precision by adopting a method of jetting one droplet in an inkjet manner to form one hemispherical micro-lens.

Technical Solution

An embodiment of the present invention provides a manufacturing method of a multilayered board, the manufacturing method including: a dot pattern forming process that forms a dot pattern including at least one hemispherical micro-lens shape by repeating a process of forming one hemispherical micro-lens shape by jetting one droplet for forming the dot pattern in an inkjet manner; and a stack pattern forming process that forms a stack pattern having a thickness less than that of the micro-lens shape by jetting a droplet for forming the stack pattern on a predetermined area around the dot pattern in the inkjet manner.

In an embodiment, a surface of the board may be surface-treated to adjust a diameter or a height of the hemispherical micro-lens shape.

In an embodiment, the surface treatment may be a hydrophilic treatment or a hydrophobic treatment.

In an embodiment, the manufacturing method may further include a cover pattern forming process that forms a cover pattern configured to cover at least a portion of each of the dot pattern and the stack pattern by jetting a droplet for forming the cover pattern on the dot pattern and a predetermined area therearound in the inkjet manner.

In an embodiment, the dot pattern forming process, the stack pattern forming process, and the cover pattern forming process may be repeatedly performed on a surface of the cover pattern.

In an embodiment, the surface of the cover pattern may be hydrophilic-treated or hydrophobic-treated.

In an embodiment, the droplet for forming the dot pattern may have a conductive characteristic or an insulating characteristic.

In an embodiment, the droplet for forming the dot pattern may have a transparent characteristic.

In an embodiment, the droplet for forming the stack pattern may have a conductive characteristic or an insulating characteristic.

In an embodiment, the droplet for forming the stack pattern may have an opaque characteristic.

In an embodiment, the droplet for forming the dot pattern and the droplet for forming the cover pattern may have the same characteristic as each other.

In an embodiment, the stack pattern may be formed in a line shape having a thickness less than a diameter of the micro-lens shape so that the stack patterns, which are adjacent to each other, are electrically disconnected from each other, and the cover pattern may connect the stack patterns, which are adjacent to each other, to each other.

Advantageous Effects

As described above, the present invention has an advantage of realizing the shape of the connection portion, which connects each of layers of the multilayered board, with high precision by adopting the method of jetting one droplet in the inkjet manner to form one hemispherical micro-lens shape.

MODE FOR CARRYING OUT THE INVENTION

The present invention may be carried out in various embodiments without departing from the technical ideas or primary features. Thus, the preferred embodiments of the present invention should be considered in descriptive sense only and are not for purposes of limitation.

It will be understood that although the terms such as 'first' and 'second' are used herein to describe various elements, these elements should not be limited by these terms.

The terms are only used to distinguish one component from other components. For example, a first element referred to as a first element in one embodiment can be referred to as a second element in another embodiment.

The word 'and/or' means that one or more or a combination of relevant constituent elements is possible.

It will also be understood that when an element is referred to as being "connected to" or "engaged with" another element, it can be directly connected to the other element, or intervening elements may also be present.

It will also be understood that when an element is referred to as being 'directly connected to' another element, there is no intervening elements.

In the following description, the technical terms are used only for explaining a specific exemplary embodiment while not limiting the present invention. The terms of a singular form may include plural forms unless referred to the contrary.

The meaning of 'include' or 'comprise' specifies a property, a number, a step, a process, an element, a component, or a combination thereof in the specification but does not exclude other properties, numbers, steps, processes, elements, components, or combinations thereof.

Unless terms used in the present invention are defined differently, the terms may be construed as meaning known to those skilled in the art.

Terms such as terms that are generally used and have been in dictionaries should be construed as having meanings matched with contextual meanings in the art. In this description, unless defined clearly, terms are not ideally, excessively construed as formal meanings.

Hereinafter, embodiments disclosed in this specification is described with reference to the accompanying drawings, and the same or corresponding components are given with the same drawing number regardless of reference number, and their duplicated description will be omitted.

Moreover, detailed descriptions related to well-known functions or configurations will be ruled out in order not to unnecessarily obscure subject matters of the present invention.

First Embodiment

Figure 1:
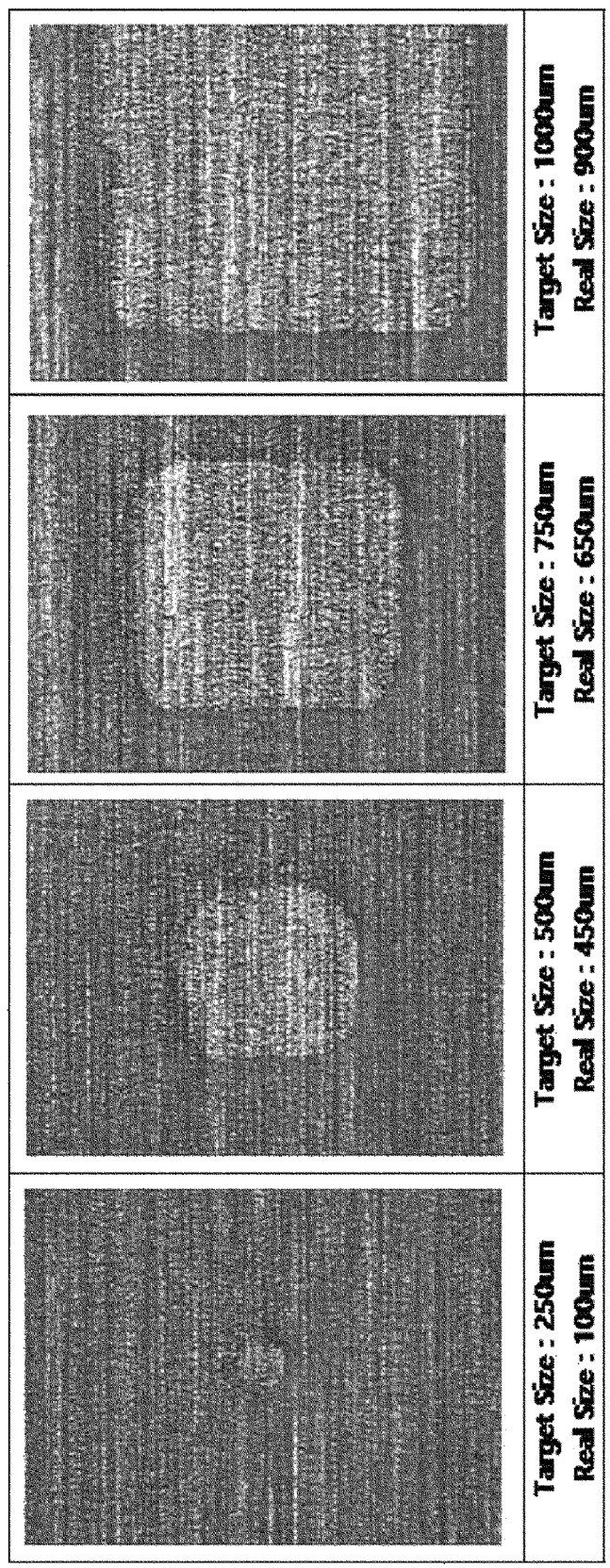
FIG. 1 is a photograph showing a printed state of a pattern by using a typical printing technology.
Figure 2:
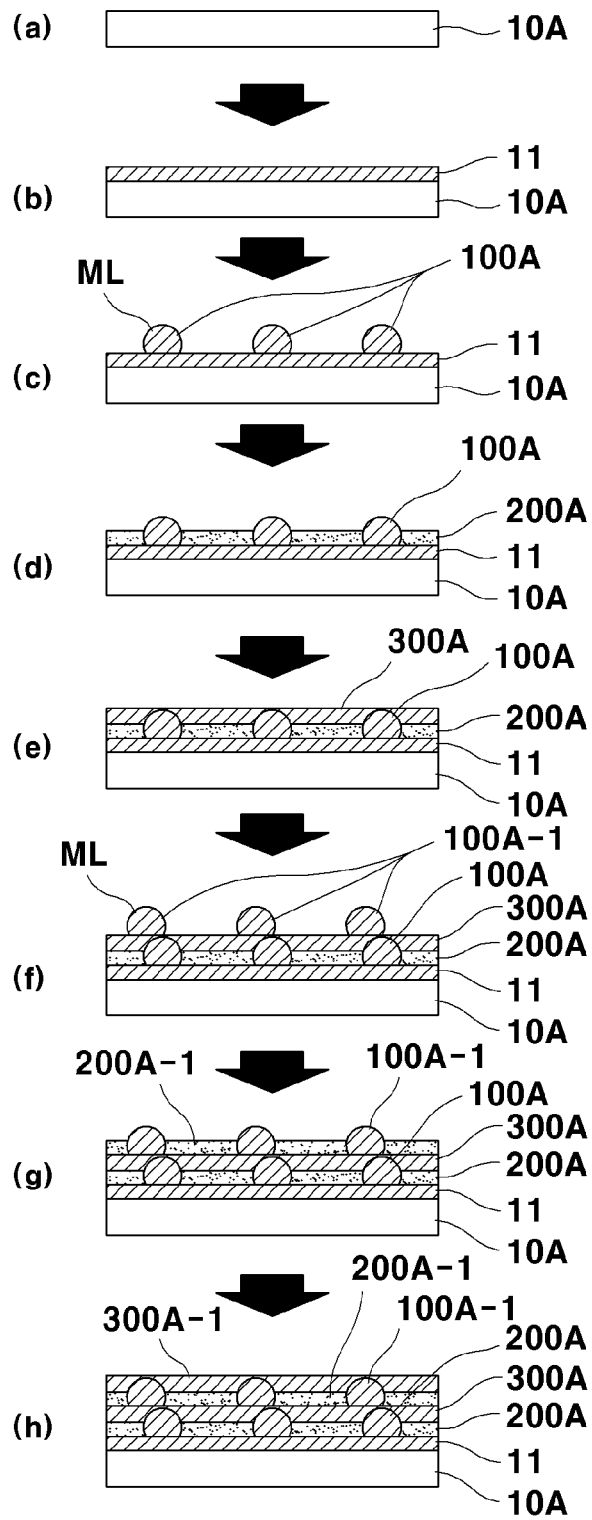
FIG. 2 is a flowchart illustrating a sequence of a manufacturing method of a multilayered board according to a first embodiment of the present invention.

FIG. 2 is a flowchart illustrating a manufacturing sequence of a multilayered board according to a first embodiment of the present invention. Hereinafter, a manufacturing method of a multilayered board according to a first embodiment will be described with reference to FIG. 2.

First, a base board 10A of a multilayered board is prepared.

The base board 10A may include various kinds of boards made of various materials such as, e.g., a ceramic material, an acrylic material, an epoxy material, a glass material, a PMMA material, polyimide, and any other polymer materials.

Thereafter, a surface of the base board 10A is surface-treated.

The surface treatment of the base board 10A forms a shape of a micro-lens ML, which is formed when a droplet is spotted on the base board 10A, into a desired shape. Here, the micro-lens ML represents an approximately hemispherical shape formed such that a droplet is jetted to and deposited on the base board 10A.

The surface treatment of the base board 10A controls the micro-lens ML to have a desired diameter or height. For example, the surface treatment of the base board 10A represents a hydrophilic treatment allowing the surface of the base board 10A to have hydrophilic characteristics or a hydrophobic treatment allowing the surface of the base board 10A to have hydrophobic characteristics.

For example, the surface of the base board 10A is hydrophilic-treated so that the micro-lens ML formed when the droplet is jetted to and deposited on the surface of the base board 10A is smoothly spread, and the surface of the base board 10A is hydrophobic-treated so that the micro-lens ML formed when the droplet jetted to and deposited on the surface of the base board 10A is convexly agglomerated.

The surface treatment of the base board 10A may include a UV treatment, a UVO treatment, a laser treatment, a plasma treatment, a primer printing treatment, and a coating treatment. In the first embodiment, a treatment of forming a coating layer 11 by printing conductive ink of which a surface has a hydrophobic property when cured on the surface of the board 10A is exemplified.

For example, the conductive ink may include a solvent and additives (leveling agents, dispersion agents, neutralizing agents, or the like) containing metallic elements such as Ag, CNT, graphene, carbon, and nickel.

Thereafter, a dot pattern forming process for forming a dot pattern 100A including at least one hemispherical micro-lens ML is performed by repeating a process of forming one hemispherical micro-lens ML by jetting one droplet for forming the dot pattern having conductive characteristics on the surface-treated base board 10A in an inkjet manner.

That is, one droplet for forming a dot pattern is jetted in the inkjet manner in correspondence to a via-hole formed position on the base board 10A, at which a via-hole is necessarily formed.

The one droplet for forming a dot pattern may adopt any technology such as an electrohydrodynamic (EHD) printing technology, a dispenser printing technology and any other jetting technologies as long as the technology is capable of jetting one droplet.

Here, when one hemispherical micro-lens ML is formed by jetting one droplet for forming the dot pattern in the inkjet manner, a shape of the hemispherical micro-lens ML may be adjusted according to a surface-treated state of the base board 10A.

That is, the surface of the base board 10A is hydrophilic-treated so that the micro-lens ML shape formed when the droplet jetted to the surface of the base board 10A is deposited is smoothly spread, and the surface of the base board 10A is hydrophobic-treated so that the micro-lens ML shape formed when the droplet jetted to the surface of the base board 10A is deposited is convexly agglomerated. Thus, a diameter and a height of the hemispherical micro-lens ML may be adjusted to have a desired value by controlling the surface treatment of the base board 10A to apply a hydrophilic property or a hydrophobic property.

For example, the conductive ink may include a solvent and additives (leveling agents, dispersion agents, neutralizing agents, or the like) containing metallic elements such as Ag, CNT, graphene, carbon, and nickel.

Thereafter, a stack pattern forming process for forming a stack pattern 200A having a thickness less than that of the micro-lens ML shape is performed by jetting a droplet for forming the stack pattern, which has insulating characteristics, on a predetermined area around the dot pattern 100A.

The stack pattern 200A functions as an insulation layer for preventing the coating layer 11 formed on the surface of the base board 10A and a cover pattern 300A, which will be described later, from being directly connected to each other. That is, the coating layer 11 and the cover pattern 300A are necessary to be electrically connected through only the micro-lens ML shape of the dot pattern 100A.

For example, as the droplet for forming the stack pattern, insulating ink, which is made of polyimide (PI), acrylic, epoxy, PMMA, glass, and any other polymer materials, which have insulating characteristics, may be used.

Thereafter, a cover pattern forming process for forming a cover pattern 300A covering at least a portion of each of the dot pattern 100A and the stack pattern 200A is performed by jetting a droplet for forming the cover pattern on the dot pattern 100A and a predetermined area therearound.

The cover pattern 300A may be a layer electrically connected to the coating layer 11 through the micro-lens ML shape. For example, the droplet for forming the cover pattern may have the same characteristic as that of the droplet for forming the dot pattern, and more particularly, the conductive ink including a solvent and additives (leveling agents, dispersion agents, neutralizing agents, or the like) containing metallic elements such as Ag, CNT, graphene, carbon, and nickel may be used.

The above-described dot pattern 100A, stack pattern 200A, and cover pattern 300A may be cured by light irradiation, and each of the stack pattern 200A and the cover pattern 300A may be printed to have a predetermined pattern shape.

Through the above-described processes, the vertically stacked two layers 11 and 300A may be formed in a predetermined pattern shape and electrically insulated from each other, and form a multilayered board in which the two layers are electrically connected only through the micro-lens ML shape of the dot pattern 100A.

Here, like (f), (g), and (h) processes in FIG. 2, as the dot pattern forming process, the stack pattern forming process, and the cover pattern forming process are repeatedly performed on a surface of the cover pattern 300A, a dot pattern 100A-1, a stack pattern 200A-1, and a cover pattern 300A-1 may be repeatedly formed.

Second Embodiment

Figure 3:
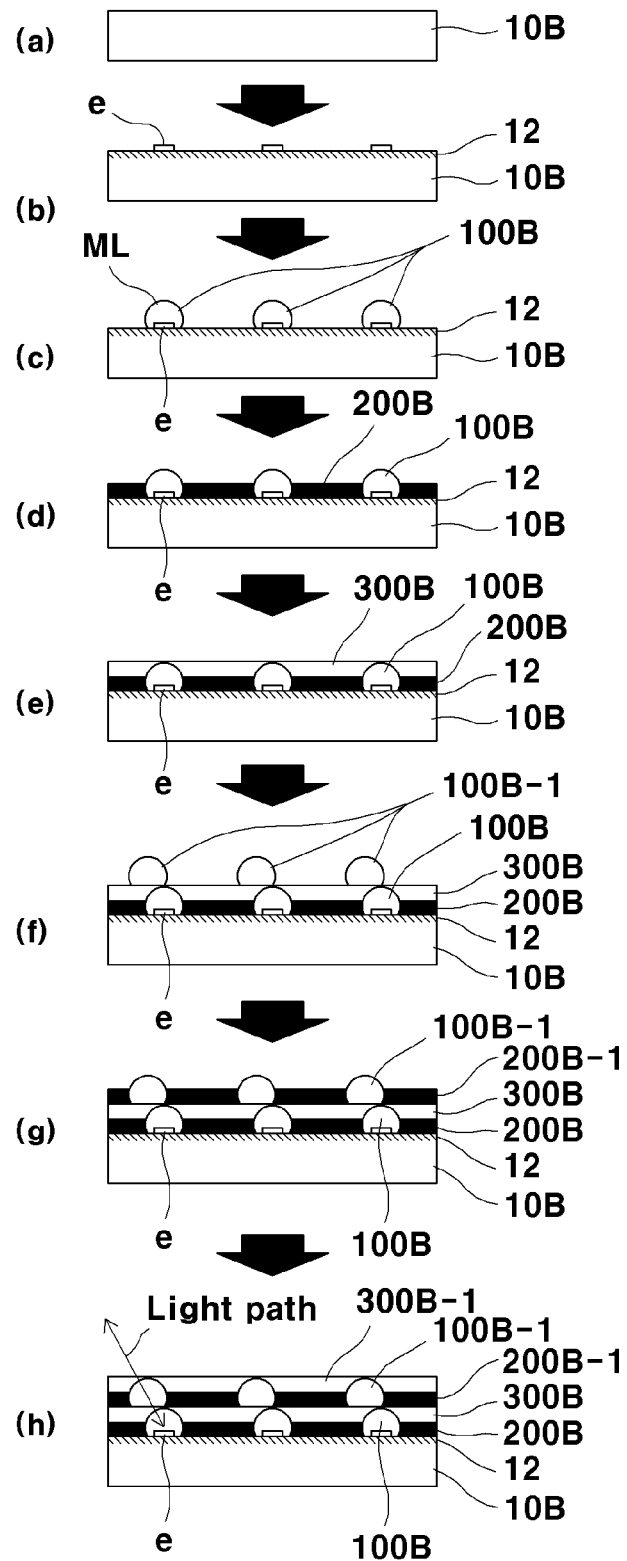
FIG. 3 is a flowchart illustrating a sequence of a manufacturing method of a multilayered board according to a second embodiment of the present invention.

FIG. 3 is a flowchart illustrating a manufacturing sequence of a multilayered board according to a second embodiment of the present invention. Hereinafter, a manufacturing method of a multilayered board according to the second embodiment will be described.

First a base board 10B of a multilayered board is prepared.

The base board 10B may include various kinds of boards made of various materials such as a ceramic material, an acrylic material, an epoxy material, a glass material, a PMMA material, polyimide, and any other polymer materials.

Thereafter, a surface of the base board 10B is surface-treated.

The surface treatment of the base board 10B forms a shape of a micro-lens ML, which is formed when a droplet is deposited on the base board 10B, into a desired shape. Here, the micro-lens ML represents an approximately hemispherical shape formed such that a droplet is jetted to and deposited on the base board 10B.

For example, the surface of the base board 10B is hydrophilic-treated so that the micro-lens ML formed when the droplet is jetted to and deposited on the surface of the base board 10B is smoothly spread, and the surface of the base board 10B is hydrophobic-treated so that the micro-lens ML shape formed when the droplet jetted to and deposited on the surface of the base board 10B is convexly agglomerated. Detailed description for this is the same as or similar to that of the first embodiment, and thus omitted.

The surface treatment of the base board 10B may include a UV treatment, a UVO treatment, a laser treatment, a plasma treatment, a primer printing treatment, and a coating treatment. In the second embodiment, the surface of the base board 10B is exemplarily hydrophobic-treated through the UV treatment.

Thereafter, a dot pattern forming process for forming a dot pattern 100B including at least one hemispherical micro-lens ML is preformed by repeating a process of forming one hemispherical micro-lens ML shape by jetting one droplet for forming the dot pattern having transparent characteristics (transmittance of at least 95%) on the surface-treated base board 10B in an inkjet manner.

Here, when one hemispherical micro-lens ML is formed by jetting one droplet for forming the dot pattern in the inkjet manner, a shape of the hemispherical micro-lens ML may be adjusted according to a surface-treated state of the base board 10B.

That is, the surface of the base board 10B is hydrophilic-treated so that the shape of the hemispherical micro-lens ML is smoothly spread, and the surface of the base board 10B is hydrophobic-treated so that the shape of the hemispherical micro-lens ML is convexly agglomerated. Thus, a diameter and a height of the hemispherical micro-lens ML may be adjusted to have a desired shape by controlling the surface treatment of the base board 10B.

The dot pattern 100B may be formed in correspondence to a position at which an optical element (e) such as an optical sensor or LED mounted on the base board 10B is disposed.

For example, as the droplet for forming the dot pattern, ink that is made of materials such as acrylic, epoxy, silicon, and any other polymer materials, which have a transmittance of 95% or more, may be used.

Thereafter, a stack pattern forming process for forming a stack pattern 200B having a thickness less than that of the micro-lens ML is performed by jetting a droplet for forming the stack pattern, which has opaque characteristics, on a predetermined area around the dot pattern 100B.

The stack pattern 200B functions as a light blocking layer for preventing light from transmitting through the rest portion except for a portion at which the micro-lens ML is formed. That is, light may transmit through only the micro-lens ML of the dot pattern 100B.

For example, as the droplet for forming the dot pattern, ink, which is made of materials such as Ag, photo resist, and carbon, and through which light is substantially not transmitted, may be used.

Thereafter, a cover pattern forming process for forming a cover pattern 300B covering at least a portion of each of the dot pattern 100B and the stack pattern 200B is performed by jetting a droplet for forming the cover pattern, which has transparent characteristics (transmittance of at least 95%), on the dot pattern 100B and a predetermined area therearound. Thereafter, the dot pattern forming process, the stack pattern forming process, and the cover pattern forming process are repeatedly performed on a surface of the cover pattern 300B

The cover pattern 300B is optically clear so that light may transmit therethrough. The cover pattern 300B may allow the stack pattern 200B, which is the firstly formed light blocking layer and disposed below the cover pattern 300B, and a stack pattern 200B-1, which is spaced apart from and disposed above the cover pattern 300B, to be spaced a predetermined distance from each other.

When a transmission direction of light is inclined, in consideration of this, the lower stack pattern 200B and the upper stack pattern 200B-1 may be offset in position by a predetermined amount from each other.

Accordingly, light may be transmitted through only a specific path in which the stack patterns 200B and 200B-1 are not formed, and the transmission direction of light may be controlled according to an offset amount.

The droplet for forming the cover pattern may have the same characteristic as that of the droplet for forming the dot pattern. Particularly, ink, which is made of materials such as acrylic, epoxy, and silicon and has a light transmittance of 95% or more, may be used as the droplet for forming the cover pattern.

Third Embodiment

Figure 4:
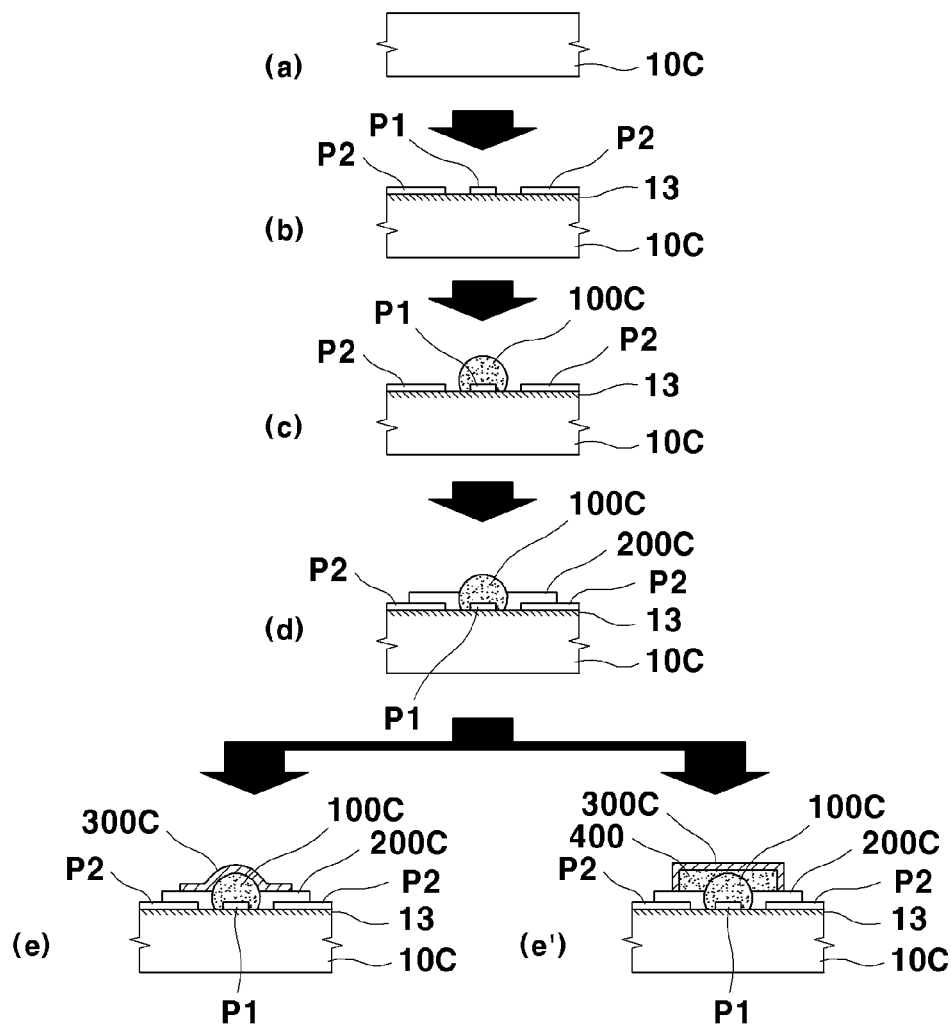
FIG. 4 is a flowchart illustrating a sequence of a manufacturing method of a multilayered board according to a third embodiment of the present invention.
Figure 4:
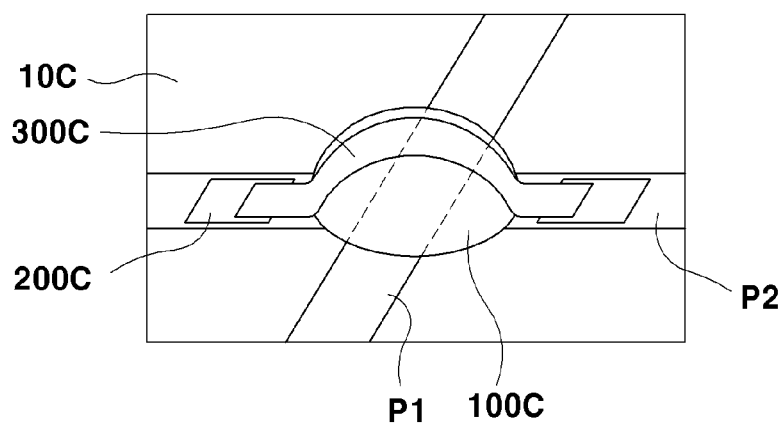

FIG. 4 is a flowchart illustrating a manufacturing sequence of a multilayered board according to a third embodiment of the present invention. Hereinafter, a manufacturing method of a multilayered board according to the third embodiment will be described.

First, a base board 10C of a multilayered board is prepared.

The base board 10C may include various kinds of boards made of various materials such as, e.g., a ceramic material, an acrylic material, an epoxy material, a glass material, a PMMA material, polyimide, and any other polymer materials.

Thereafter, a surface of the base board 10C is surface-treated.

The surface treatment of the base board 10C forms a shape of a micro-lens ML, which is formed when a droplet is deposited on the base board 10C, into a desired shape. Here, the micro-lens ML represents an approximately hemispherical shape formed such that a droplet is jetted to and deposited on the base board 10C.

The surface treatment of the base board 10C is performed to adjust a diameter or a height of the micro-lens ML. The surface treatment represents a treatment for applying hydrophilic characteristics to the surface of the base board 10C or a treatment for applying hydrophobic characteristics to the surface of the base board 10C.

For example, the surface of the base board 10C is hydrophilic-treated so that the micro-lens ML formed when the droplet is jetted to and deposited on the surface of the base board 10B is smoothly spread, and the surface of the base board 10C is hydrophobic-treated so that the micro-lens ML formed when the droplet jetted to and deposited on the surface of the base board 10B is convexly agglomerated.

The surface treatment of the base board 10C may include a UV treatment, a UVC; treatment, a laser treatment, a plasma treatment, a primer printing treatment, and a coating treatment. In the third embodiment, the surface of the base board 10C is exemplarily hydrophobic-treated through the UV treatment.

Thereafter, a dot pattern forming process for forming a dot pattern 100C including at least one hemispherical micro-lens ML is preformed by repeating a process of forming one hemispherical micro-lens ML by jetting one droplet for forming the dot pattern, which has insulating characteristics, on the surface-treated base board 10C in an inkjet manner.

Here, a position at which each of the micro-lenses ML is formed corresponds to micro-lines P1 and P2 for a circuit formed on the base board 10C. Particularly, the position is a position at which two different micro-lines P1 and P2, which are disposed below and above the micro-lens ML, respectively, cross each other.

That is, the micro-lens ML is formed at a position at which the two micro-lines P1 and P2 for a circuit cross each other, and formed by jetting one droplet for forming the dot pattern in the inkjet manner in correspondence to a portion at which a pair of micro-lines for a circuit, which cross each other, are necessary to be electrically disconnected.

Here, when one hemispherical micro-lens ML shape is formed by jetting one droplet for forming the dot pattern in the inkjet manner, a shape of the hemispherical micro-lens ML shape may be adjusted according to a surface-treated state of the base board 10C.

That is, the surface of the base board 10C is hydrophilic-treated so that the shape of the hemispherical micro-lens ML is smoothly spread, and the surface of the base board 10C is hydrophobic-treated so that the shape of the hemispherical micro-lens ML is convexly agglomerated. Thus, a diameter and a height of the hemispherical micro-lens ML may be adjusted to have a desired value by controlling the surface treatment of the base board 10C.

The hemispherical micro-lens ML may be formed to have a diameter greater than that of each of the micro-lines P1 and P2 for a circuit formed on the base board 10C, thereby entirely covering the micro-lines P1 and P2 for a circuit.

For example, as the droplet for forming the dot pattern, ink, which is made of materials such as polyimide (PI), acrylic, epoxy, and any other polymers and has insulating characteristics, may be used.

Thereafter, a stack pattern forming process for forming a stack pattern 200C having a thickness less than that of the micro-lens ML is performed by jetting a droplet for forming the stack pattern, which has conductive characteristics, on a predetermined area around the dot pattern 100C.

The stack pattern 200C is a portion that connects a lower micro line P1, which is disposed below the micro-lens ML, and an upper micro line P2, which is electrically disconnected from the lower micro-line P1. The stack pattern 200C has a thickness less than a diameter of the micro-lens ML.

For example, the conductive ink may include a solvent and additives (leveling agents, dispersion agents, neutralizing agents, or the like) containing metallic elements such as Ag, CNT, graphene, carbon, and nickel.

Thereafter, a cover pattern forming process for forming a cover pattern 300C covering at least a portion of each of the dot pattern 100C and the stack pattern 200C is performed by jetting a droplet for forming the cover pattern on the dot pattern 100B and a predetermined area therearound in the inkjet manner.

The cover pattern 300C may be a portion that electrically connects the upper micro-lines P2 through an upper portion of the micro-lens ML. As the droplet for forming the cover pattern, conductive ink including a solvent and additives (leveling agents, dispersion agents, neutralizing agents, or the like) containing metallic elements such as Ag, CNT, graphene, carbon, and nickel may be used.

Alternatively, before the cover pattern 300C is formed, insulating ink having the same constituents as those of the micro-lens ML may be formed into a block shape, and then the cover pattern 300C may be formed.

On the other hand, the above-described dot pattern 100C, stack pattern 200C, and cover pattern 300C may be cured by light irradiation.

Through the above-described processes, the two micro-lines P1 and P2 may cross each other while being electrically disconnected at a position at which the micro-lines cross each other.

While the present invention has been particularly shown and described with reference to the accompanying drawings according to exemplary embodiments, it will be understood by those of ordinary skill in the art that various changes in form and details may be made therein without departing from the spirit and scope of the present invention as defined by the following claims. Hence, the real protective scope of the present invention shall be determined by the technical scope of the accompanying claims.

The invention claimed is:

1. A manufacturing method of a multilayered board, comprising:
    a dot pattern forming process that forms a dot pattern comprising a plurality of hemispherical micro-lens shapes by repeating a process of forming one hemispherical micro-lens shape by jetting one droplet for forming the dot pattern in an inkjet manner, wherein the droplet for forming the dot pattern has a transparent characteristic and is formed corresponding to a position of an optical element mounted on a surface of a base board;
    a stack pattern forming process that forms a stack pattern having a thickness less than that of the plurality of hemispherical micro-lens shapes by jetting a droplet for forming the stack pattern on a predetermined area around and in contact with each hemispherical micro-lens shape in the inkjet manner, wherein the droplet for forming the stack pattern has an opaque characteristic; and
    a cover pattern forming process that forms a cover pattern covering an entire portion of the dot pattern and the stack pattern by jetting a droplet for forming the cover pattern on the hemispherical micro-lens shapes and a predetermined area therearound in the inkjet manner, wherein an upper end of the cover pattern matches with a surface of a top portion of the dot pattern to form the multilayered board,
    wherein the dot pattern forming process, the stack pattern forming process, and the cover pattern forming process are repeatedly performed on a surface of the cover pattern,
    wherein light is enabled to be transmitted to or from the optical element only along a path passing through the plurality of hemispherical micro-lens shapes formed through repeating the dot pattern forming process.

2. The manufacturing method of claim 1, wherein the surface of the base board is surface-treated to adjust a diameter or a height of the hemispherical micro-lens shapes.

3. The manufacturing method of claim 2, wherein the surface treatment is a hydrophilic treatment or a hydrophobic treatment.

4. The manufacturing method of claim 1, wherein the surface of the cover pattern is hydrophilic-treated or hydrophobic-treated.

* * * * *